US012660480B2

(12) United States Patent
Ju et al.

(10) Patent No.: US 12,660,480 B2
(45) Date of Patent: Jun. 16, 2026

(54) DISPLAY DEVICE COMPRISING FILLING LAYER

(71) Applicant: Samsung Display Co., Ltd., Yongin-si (KR)

(72) Inventors: Yongchan Ju, Yongin-si (KR); Yeonguk Kim, Yongin-si (KR); Jongwoo Kim, Yongin-si (KR); Heeyeon Park, Yongin-si (KR); Changyeong Song, Yongin-si (KR); Hyein Yang, Yongin-si (KR); Soyoung Oh, Yongin-si (KR); Jongkwang Yun, Yongin-si (KR); Woosuk Jung, Yongin-si (KR); Jaeheung Ha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 362 days.

(21) Appl. No.: 18/334,579

(22) Filed: Jun. 14, 2023

(65) Prior Publication Data

US 2024/0032395 A1 Jan. 25, 2024

(30) Foreign Application Priority Data

Jul. 22, 2022 (KR) ........................ 10-2022-0091250

(51) Int. Cl.

| | |
|---|---|
| ***H10K 59/80*** | (2023.01) |
| ***H10K 50/844*** | (2023.01) |
| ***H10K 85/40*** | (2023.01) |
| ***H10K 85/60*** | (2023.01) |
| ***H10K 102/00*** | (2023.01) |

(52) U.S. Cl.

CPC ......... *H10K 59/873* (2023.02); *H10K 50/844* (2023.02); *H10K 59/879* (2023.02);

(Continued)

(58) Field of Classification Search

CPC .. H10K 59/873; H10K 50/844; H10K 59/879; H10K 85/40; H10K 85/615;

(Continued)

(56) References Cited

U.S. PATENT DOCUMENTS 6,054,651 A * 4/2000 Fogel ........................ H01B 3/46
174/110 F
8,629,615 B2 * 1/2014 Kim ........................ H10K 59/87
313/506

(Continued)

FOREIGN PATENT DOCUMENTS

JP 6471416 B2 2/2019
KR 10-2010-0044624 A 4/2010

(Continued)

*Primary Examiner* — Caleb E Henry

(74) *Attorney, Agent, or Firm* — Womble Bond Dickinson (US) LLP

(57) ABSTRACT

Provided is a display device including a base layer, a pixel defining film, a display element layer including a light-emitting element divided by a pixel defining film, an encapsulation substrate on the display element layer, and a filling layer between the display element layer and the encapsulation substrate and including a filler derived from a mixture having a first polymer compound containing a first monomer represented by Formula 1 below, a second polymer compound containing a second monomer represented by Formula 2 below, and a plurality of crosslinking compounds.

19 Claims, 5 Drawing Sheets

(52) U.S. Cl.
CPC ........... *H10K 85/40* (2023.02); *H10K 85/615* (2023.02); *H10K 85/631* (2023.02); *H10K 85/633* (2023.02); *H10K 85/6572* (2023.02); *H10K 2102/351* (2023.02)

(58) Field of Classification Search
CPC ............... H10K 85/631; H10K 85/633; H10K 85/6572; H10K 2102/351; H10K 59/12; H10K 50/8426; H10K 50/15; H10K 50/16; H10K 50/81; H10K 50/82; C08F 230/08; C08G 77/12; C08G 77/20; H01L 51/5256; H01L 51/56
See application file for complete search history.

(56) References Cited

U.S. PATENT DOCUMENTS

| | | | | |
|---|---|---|---|---|
| 8,866,383 | B2 | 10/2014 | Jang et al. | |
| 10,205,123 | B2 * | 2/2019 | Jin | H10K 50/8445 |
| 10,858,539 | B2 | 12/2020 | Bae et al. | |
| 11,028,266 | B2 * | 6/2021 | Yang | C08K 5/5425 |
| 2001/0018491 | A1 * | 8/2001 | Shiono | C09J 183/08 525/100 |
| 2012/0168815 | A1 | 7/2012 | Koh et al. | |
| 2017/0037277 | A1 * | 2/2017 | Oh | H10K 10/88 |
| 2019/0157607 | A1 * | 5/2019 | Kim | H10K 77/111 |
| 2021/0002482 | A1 * | 1/2021 | Thiria | B29C 64/106 |
| 2022/0162397 | A1 * | 5/2022 | Takeuchi | C08G 77/50 |
| 2022/0204771 | A1 * | 6/2022 | Horie | C08G 77/12 |

FOREIGN PATENT DOCUMENTS

| | | | |
|---|---|---|---|
| KR | 10-0976457 | B1 | 8/2010 |
| KR | 10-2012-0078606 | A | 7/2012 |
| KR | 10-1760806 | B1 | 7/2017 |
| KR | 10-2052359 | B1 | 12/2019 |

* cited by examiner

DISPLAY DEVICE COMPRISING FILLING LAYER

CROSS-REFERENCE TO RELATED APPLICATIONS

This application claims priority to and the benefit of Korean Patent Application No. 10-2022-0091250, filed on Jul. 22, 2022, the entire contents of which are hereby incorporated by reference.

BACKGROUND

1. Field

Embodiments of the present disclosure herein relate to a display device including a filling layer between a display panel and an encapsulation substrate.

2. Description of the Related Art

An organic light-emitting display device includes an organic light-emitting element including an anode, an organic light-emitting layer, and a cathode. The organic light-emitting layer is very vulnerable to moisture and/or oxygen. For example, when moisture and/or oxygen permeates from the outside of the organic light-emitting display device, the light-emitting layer may deteriorate and various defects such as dark spots and/or pixel shrinkage may occur. Accordingly, an encapsulation part for protecting the organic light-emitting element is used.

SUMMARY

Embodiments of the present disclosure provide a display device having excellent display quality, including a filling layer between a display panel and an encapsulation substrate.

Embodiments of the present disclosure provide a display device including: a base layer; a display element layer including a light-emitting element on the base layer; an encapsulation substrate on the display element layer; and a filling layer between the display element layer and the encapsulation substrate and including a filler derived from a mixture having a first polymer compound containing a first monomer represented by Formula 1 below, a second polymer compound containing a second monomer represented by Formula 2 below, and a crosslinking compound

[Formula 1]

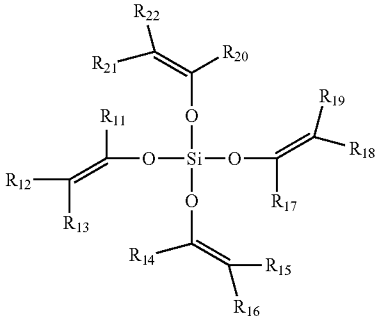

-continued

[Formula 2]

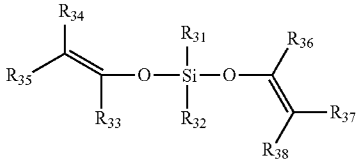

wherein, in Formula 1, $R_1$ to $R_{22}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group, and in Formula 2, $R_{31}$ to $R_{38}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group.

In some embodiments, the crosslinking compound may include a third monomer represented by Formula A below.

[Formula A]

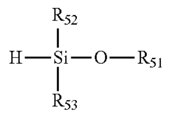

wherein, in Formula A, $R_{51}$ to $R_{53}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group.

In some embodiments, in Formula A, the third monomer may include a first sub-monomer in which at least one of $R_{52}$ or $R_{53}$ is a substituted or unsubstituted phenyl group, and a second sub-monomer in which neither $R_{52}$ nor $R_{53}$ is a substituted or unsubstituted phenyl group.

In some embodiments, the crosslinking compound may include about 20% to about 50% of the first sub-monomer with respect to the total number of the third monomer.

In some embodiments, in the mixture, the mass ratio between the first polymer compound and the crosslinking compound may be about 2:1 to about 8:1.

In some embodiments, at least one selected from among $R_{11}$ to $R_{22}$ in Formula 1 and $R_{31}$ to $R_{38}$ in Formula 2 may be an epoxy group.

In some embodiments, the encapsulation substrate may be a glass substrate.

In some embodiments, the mixture may have a viscosity of about 1000 cP to about 20000 cP at 25° C.

In some embodiments, the filling layer may have a thickness of about 4 μm to about 8 μm.

In some embodiments, the filling layer may have a refractive index of about 1.4 to about 1.5.

In some embodiments, a transmittance of the filling layer with respect to light having a center wavelength of about 400 nm to about 700 nm may be about 90% or more.

In some embodiments, the mixture may further include a thermal initiator and a polymerization inhibitor.

In some embodiments, the light-emitting element may include: a first electrode; a hole transport region on the first electrode; a light-emitting layer on the hole transport region; an electron transport region on the light-emitting layer; a second electrode on electron transport region; and a capping layer on the second electrode.

In some embodiments, the capping layer may include at least one among compounds P1 to P5 below.

P1

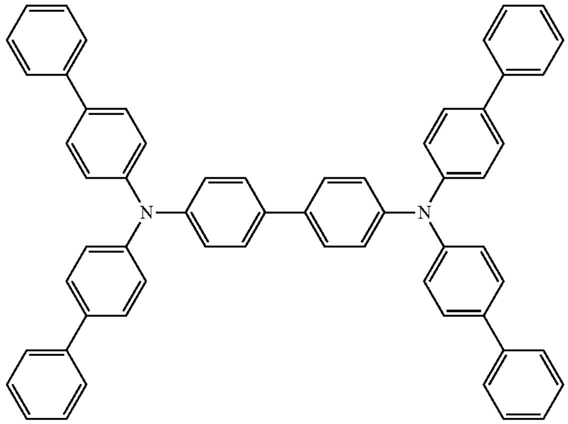

P2

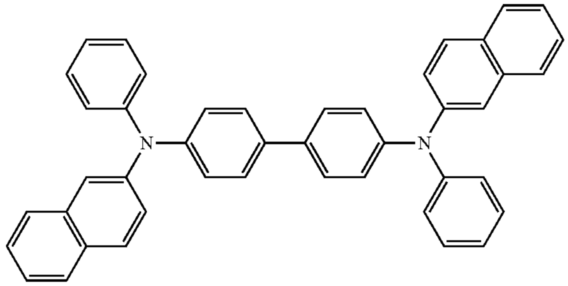

P3

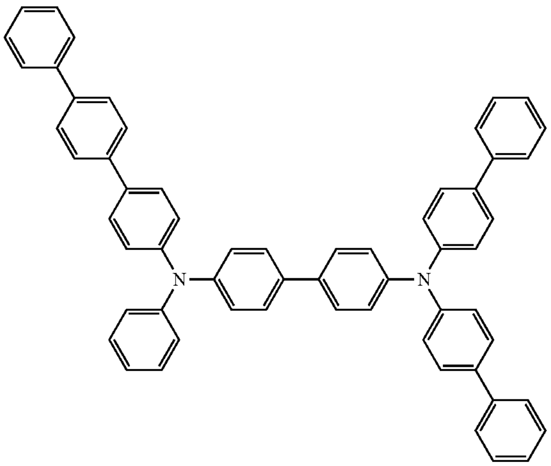

-continued

P4

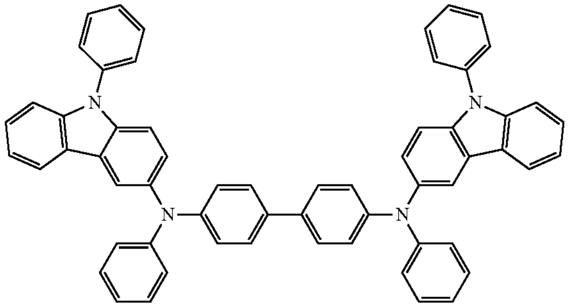

P5

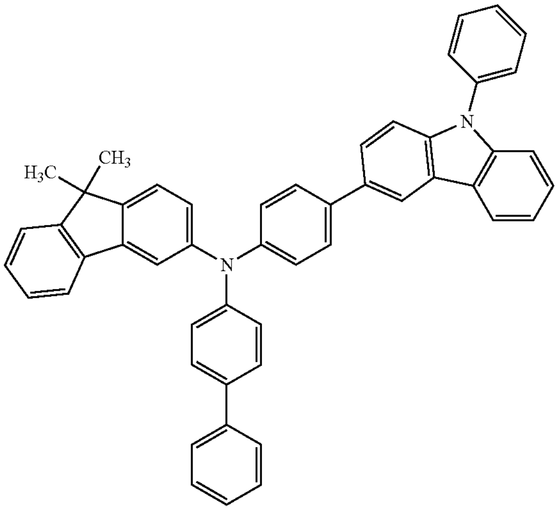

.

In some embodiments of the present disclosure, a display device includes: a base layer; a display element layer on the base layer and including a light-emitting element; an encapsulation substrate on the display element layer; and a filling layer between the display element layer and the encapsulation substrate and including a filler derived from a mixture containing a first polymer compound, a second polymer compound, and a crosslinking compound, wherein the first polymer compound includes a first monomer having a first silicon atom and four vinyl alkoxy groups each containing a vinyl group at a terminal end thereof and each bonded to the first silicon atom, and the second polymer compound includes a second monomer having a second silicon atom and two vinyl alkoxy groups each containing a vinyl group at a terminal end thereof and each bonded to the second silicon atom.

In some embodiments, the first monomer may be represented by Formula 1 below, and the second monomer may be represented by Formula 2 below.

[Formula 1]

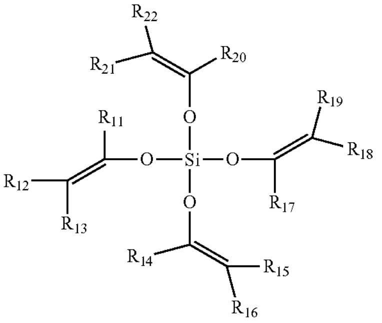

[Formula 2]

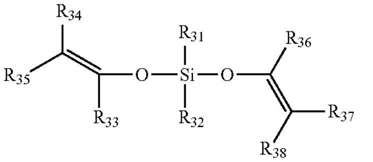

where, in Formula 1, $R_{11}$ to $R_{22}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group, and in Formula 2, $R_{31}$ to $R_{38}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group.

In some embodiments, at least one selected from among $R_{11}$ to $R_{22}$ in Formula 1 and $R_{31}$ to $R_{38}$ in Formula 2 may be an epoxy group.

In some embodiments, the crosslinking compound may include a third monomer represented by Formula A below

[Formula A]

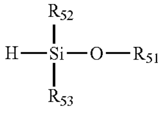

wherein, in Formula A, $R_{51}$ to $R_{53}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group.

In some embodiments, in Formula A, the third monomer may include a first sub-monomer in which at least one of $R_{52}$ or $R_{53}$ is a substituted or unsubstituted phenyl group, and a second sub-monomer in which neither $R_{52}$ nor $R_{53}$ may be a substituted or unsubstituted phenyl group.

In some embodiments, the light-emitting element may include: a first electrode; a hole transport region on the first electrode; a light-emitting layer on the hole transport region; an electron transport region on the light-emitting layer; a second electrode on electron transport region; and a capping layer on the second electrode, the capping layer including an organic material.

BRIEF DESCRIPTION OF THE DRAWINGS

The accompanying drawings are included to provide a further understanding of the subject matter of the present disclosure, and are incorporated in and constitute a part of this specification. The drawings illustrate embodiments of the present disclosure and, together with the description, serve to explain principles of the subject matter of the present disclosure. In the drawings.

DETAILED DESCRIPTION

Figure 1:
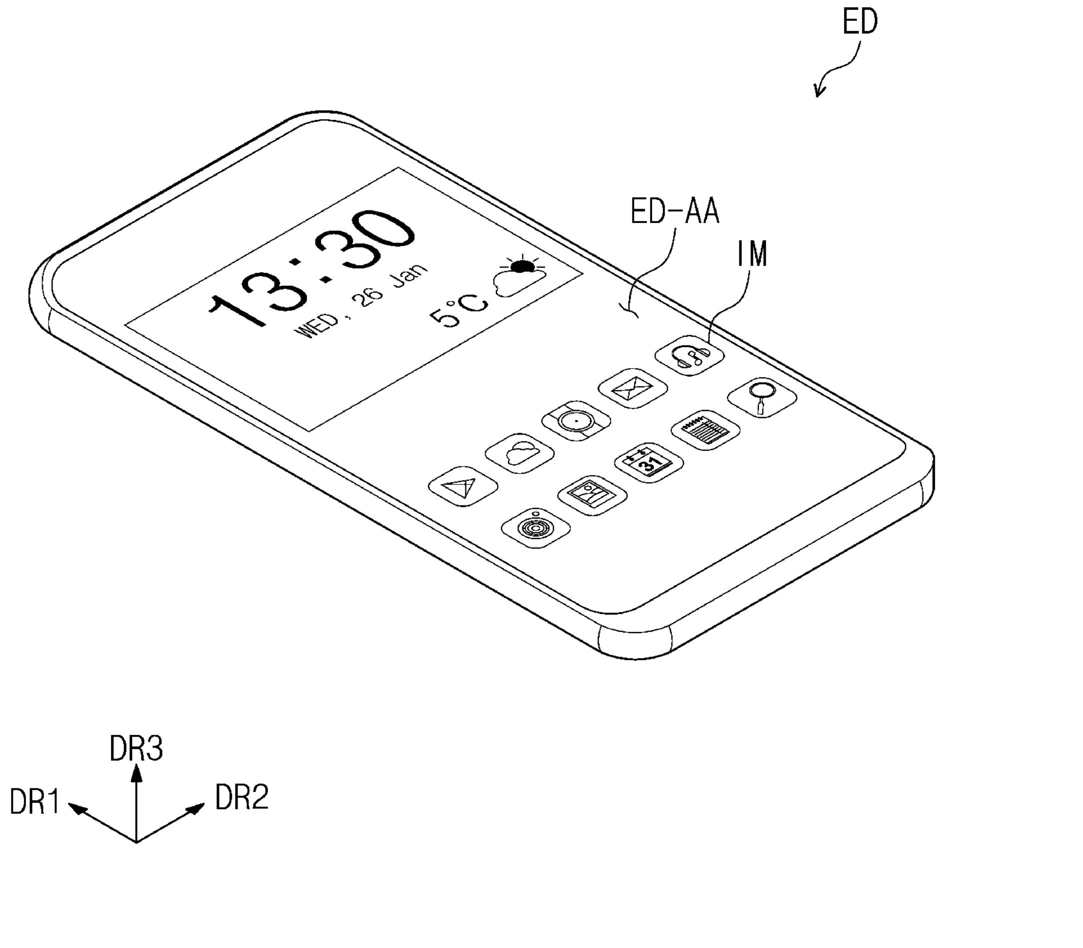
FIG. 1 is a perspective view illustrating a display device according to embodiments.

The subject matter of the present disclosure may be implemented to have various modifications and have various forms and example embodiments are illustrated in the drawings and described in more detail in the text. It is to be understood, however, that the subject matter of the present disclosure is not intended to be limited to the particular forms disclosed, but on the contrary, is intended to cover all modifications, equivalents, and alternatives falling within the spirit and scope of the present disclosure.

In this specification, it will be understood that when an element (or a region, a layer, a portion, or the like) is referred to as being "on", "connected to" or "coupled to" another element, it can be directly on, connected or coupled to another element mentioned above, or intervening elements may be therebetween.

In the present application, "directly on" means that there is no additional layer, film, region, plate, or the like added between the portion of the layer, film, region. For example, "directly on" may mean on without additional members such as adhesive members between two layers or two members.

Like numbers or symbols refer to like elements throughout. Also, in the drawings, the thicknesses, ratios, and dimensions of the elements may be exaggerated for effective description of the technical contents.

The term "and/or" includes all of one or more combinations which can be defined by related components.

Although the terms first, second, etc. may be used to describe various elements, these elements should not be limited by these terms. These terms are only used to distinguish one element from another element. For example, a first element may be referred to as a second element, and similarly, a second element may also be referred to as a first element without departing from the scope of the present disclosure. The singular forms include the plural forms as well, unless the context clearly indicates otherwise.

Also, terms such as "below", "lower", "above", and "upper" may be used to describe the relationships of the components illustrated in the drawings. These terms are relative concepts and are described on the basis of the directions indicated in the drawings. In this specification, being "on" may represent not only being on the top surface but also being on the bottom surface.

Unless otherwise defined, all terms (including technical and scientific terms) used herein have the same meaning as commonly understood by one of ordinary skill in the art to which the present disclosure belongs. Also, terms, such as those defined in commonly used dictionaries, should be interpreted as having a meaning that is consistent with their meaning in the context of the relevant art and should not be interpreted in an idealized or overly formal sense unless expressly so defined herein.

It will be understood that the terms "includes" or "comprises", when used in this specification, specify the presence of stated features, numbers, steps, operations, elements, components, or a combination thereof, but do not preclude the presence or addition of one or more other features, numbers, steps, operations, elements, components, or combinations thereof.

Hereinafter, a display device according to embodiments of the present disclosure will be described with reference to the drawings.

Figure 2:
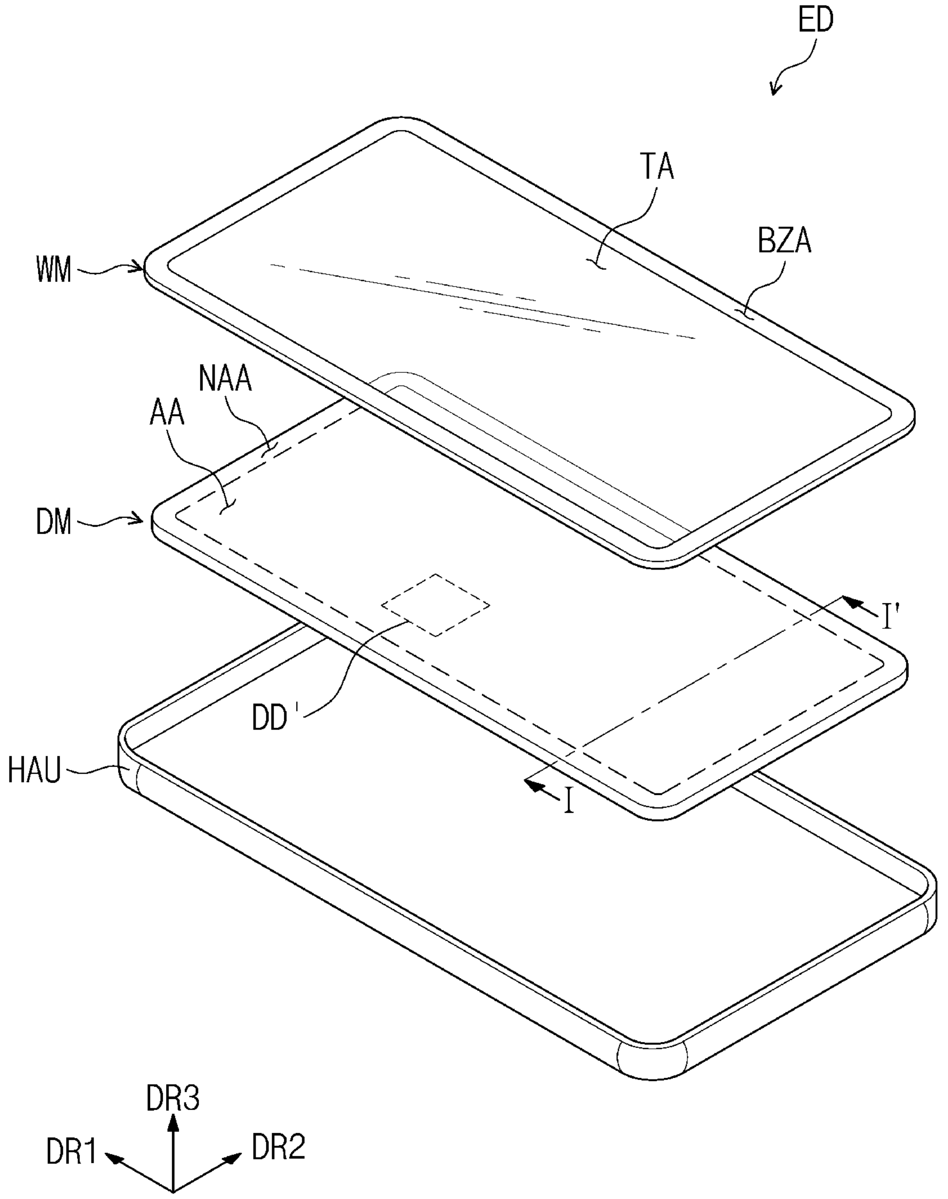
FIG. 2 is an exploded perspective view illustrating a display device according to embodiments.
Figure 3:
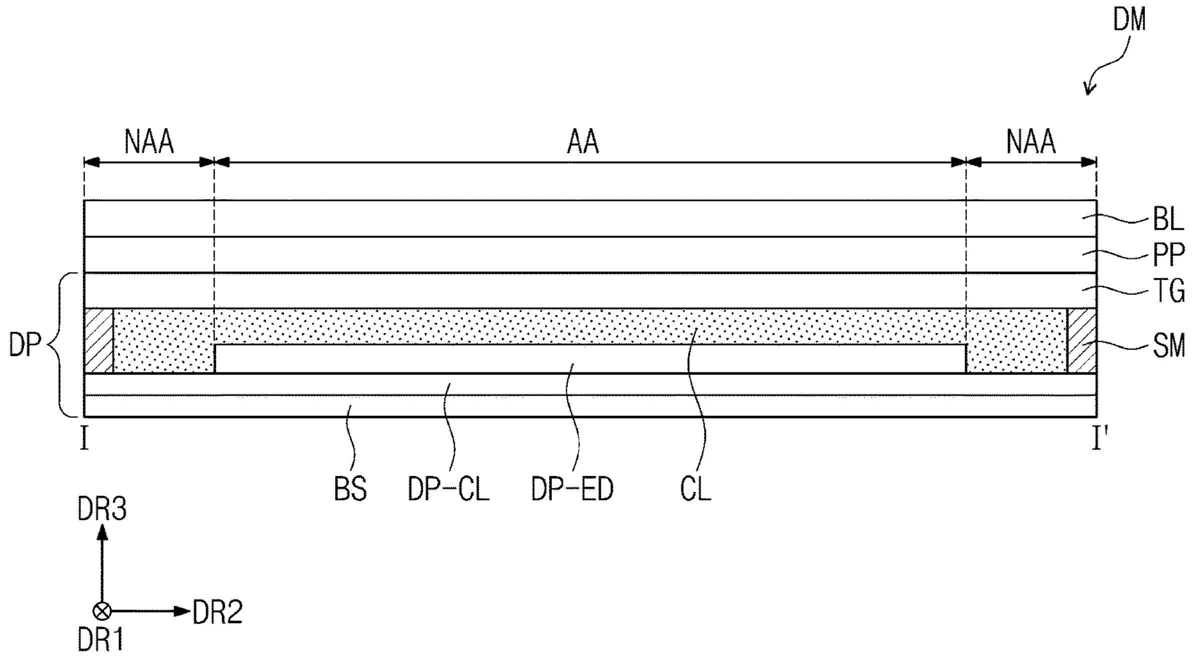
FIG. 3 is a cross-sectional view schematically illustrating a section taken along line I-I' of FIG. 1.

FIG. 1 is a perspective view illustrating a display device according to embodiments. FIG. 2 is an exploded perspective view illustrating a display device according to embodiments. FIG. 3 is a cross-sectional view schematically illustrating a section taken along line I-I' of FIG. 2.

A display device ED according to embodiments illustrated in FIGS. 1 to 3 may be a device activated in response to an electrical signal. For example, the display device ED may be a mobile phone, a tablet PC, a car navigation monitor, a game console, or a wearable device, but embodiments of the present disclosure are not limited thereto. In FIG. 1, the display device ED is illustratively shown as a mobile phone, but the present disclosure is not limited thereto.

The display device ED may display an image IM through an active region ED-AA. The active region ED-AA may include a plane defined by a first direction axis DR1 and a second direction axis DR2. The active region ED-AA may further include a curved surface that bends from at least one side of the plane defined by the first direction axis DR1 and the second direction axis DR2. For example, the active region ED-AA may include only the plane, or the active region ED-AA may further include four curved surfaces that bend respectively from at least two or more, for example, four sides of the plane.

Here, in FIG. 1 and the following drawings, first directional axis DR1 to third directional axis DR3 are illustrated. The directions indicated by the first to third directional axes DR1, DR2, and DR3 illustrated herein may be a relative concept, and thus, be changed to other directions. In addition, the directions indicated by the first to third direction axes DR1, DR2, and DR3 may be referred to as first to third directions, and may thus be denoted as the same reference numerals or symbols.

In this specification, the first direction axis DR1 may be perpendicular to the second direction axis DR2, and the third direction axis DR3 may be a normal direction of the plane defined by the first direction axis DR1 and the second direction axis DR2.

A thickness direction of the display device ED may be parallel to a third direction axis DR3 that is a normal direction of the plane defined by the first direction axis DR1 and the second direction axis DR2. In this specification, a front surface (or a top surface) and a rear surface (or a bottom surface) of each member constituting the display device ED may be defined with respect to the third direction axis DR3.

The image IM provided from the display device ED according to some embodiments may include static images as well as dynamic images. In FIG. 1, a clock window and icons are illustrated as examples of the image IM, but the present disclosure is not limited thereto. A surface, on which the image IM is displayed, may correspond to a front surface of the display device ED and may correspond to a front surface of a window member WM.

Also, the display device ED according to some embodiments may sense a user's input applied from the outside. The user's input includes various suitable types or kinds of external inputs such as a portion of the user's body, light, heat, and/or pressure. The display device ED according to some embodiments may sense the user's input through the active region ED-AA, and may respond to the sensed input signal. Also, the display device ED may also sense a user's input applied to a side surface or a bottom surface thereof depending on the design given to the display device ED, and is not limited to any one embodiment.

Referring to FIGS. 2 and 3, the display device ED according to some embodiments may include a display module DM, a window member WM, and a housing HAU. In some embodiments, the window WM and the housing HAU may be coupled to each other to form an exterior of the display device ED.

The display module DM according to some embodiments may be divided into an active region AA and a peripheral region NAA. The active region AA may be activated in response to an electrical signal. As described above, the active region AA may be a portion that displays an image or senses an external input.

The peripheral region NAA may be a region positioned adjacent to at least one side of the active region AA. The peripheral region NAA may surround the active region AA. However, embodiments of the present disclosure are not limited thereto. In some embodiments, a portion of the peripheral region NAA may be omitted unlike what is illustrated in FIG. 2, etc. A driving circuit, a driving line, and/or the like for driving the active region AA may be in the peripheral region NAA.

The display module DM according to some embodiments may include a display panel DP, an optical layer PP, and a base substrate BL. The optical layer PP may be on the display panel DP and may control light reflected from the display panel DP by external light. The optical layer PP may include, for example, a polarizing layer and/or a color filter layer. In some embodiments, unlike what is illustrated in the drawings, the optical layer PP may be omitted in the display device ED according to some embodiments.

The base substrate BL may be on the optical layer PP. The base substrate BL may be a member for providing a base surface on which the optical layer PP is located. The base substrate BL may be a glass substrate, a metal substrate, a plastic substrate, and/or the like. However, embodiments of the present disclosure are not limited thereto, and the base substrate BL may be an inorganic layer, an organic layer, or a composite material layer. In addition, unlike the configuration illustrated, the base substrate BL may be omitted in some embodiments.

The display panel DP includes a base layer BS, a circuit layer DP-CL on the base layer BS, a display element layer DP-ED, an encapsulation substrate TG, and a sealing member SM.

The encapsulation substrate TG according to some embodiments may be a transparent substrate. The encapsulation substrate TG may include a glass substrate. In addition, the encapsulation substrate TG may include a substrate having a substantially constant refractive index in a visible light wavelength range. The sealing member SM may couple the base layer BS and the circuit layer DP-CL to the encapsulation substrate TG. The sealing member SM may extend along an edge of the encapsulation substrate TG. The encapsulation substrate TG and the sealing member SM may prevent or reduce permeation of moisture to or from the display panel DP.

The sealing member SM may include an inorganic adhesive layer such as frit. Embodiment of the present disclosure are not limited thereto, and the sealing member SM may include an organic adhesive layer. In this embodiment, because the display panel DP may be completely sealed from the outside, the strength thereof may be enhanced, and a defect of a light-emitting element may be prevented or (or a likelihood or degree of formation of such a defect may be reduced).

The display panel DP may include a filling layer CL between the encapsulation substrate TG and the display element layer DP-ED. The filling layer CL may improve the optical clear performance of the display device ED and may function to planarize an internal configuration of the display device ED. The description of the filling layer CL will be described herein below in more detail.

The circuit layer DP-CL includes at least one insulating layer, semiconductor patterns, or conductive patterns. The insulating layer includes at least one inorganic layer and at least one organic layer. The semiconductor patterns and the conductive patterns may constitute signal lines, a pixel driving circuit, and a scan driving circuit. This will be described herein below in more detail.

The display element layer DP-ED includes a display element, for example, an organic light-emitting element. The display element layer DP-ED may further include an organic layer such as, for example, a pixel defining film.

A display region and a non-display region may be defined in the display panel DP. The display region of the display panel DP may correspond to the active region ED-AA of the display device ED. In this embodiment, the wording that regions of different members correspond to each other means that these regions overlap each other, but does not necessarily mean that they are limited to having the same area/shape.

In some embodiments, the display device ED according to some embodiments may further include a window member WM on the display module DM. FIG. 2 illustrates that the window member WM is directly on the display module DM, but embodiments of the present disclosure are not limited thereto. For example, the display device ED according to some embodiments may further include an adhesive layer between the window member WM and the display module DM. The adhesive layer may be an optically clear adhesive (OCA) film and/or an optically clear adhesive resin (OCR) layer.

The window member WM may cover the entire outer side of the display module DM. The window member WM may have a shape that conforms to the shape of the display module DM. In the display device ED according to some embodiments, the window member WM may include an optically transparent insulating material. The window member WM may be a glass substrate and/or a polymer substrate. For example, the window member WM may be a tempered glass substrate which has been subjected to reinforcement treatment. The window member WM may correspond to an uppermost layer of the display device ED.

Also, the window member WM in the display device ED according to some embodiments may be divided into a transmission portion TA and a bezel portion BZA. The transmission portion TA may be a portion corresponding to the active region AA of the display module DM, and the bezel portion BZA may be a portion corresponding to the peripheral region NAA of the display module DM.

The front surface of the window member WM including the transmission portion TA and the bezel portion BZA may correspond to the front surface of the display device ED. A user may view an image which is provided through the transmission portion TA corresponding to the front surface of the display device ED.

The bezel portion BZA may define the shape of the transmission portion TA. The bezel portion BZA may be adjacent to the transmission portion TA and may surround the transmission portion TA. However, embodiments of the present disclosure are not limited to what is illustrated in the drawings. The bezel portion BZA may be adjacent to only one side of the transmission portion TA, or may be partially omitted.

In the display device ED according to some embodiments, a portion of the display device ED, which is viewed through the bezel portion BZA, may have a light transmittance relatively lower than that of a portion, which is viewed through the transmission portion TA. Also, in the display device ED according to some embodiments, the bezel portion BZA may be a portion which is viewed as having a set or predetermined color.

Figure 4:
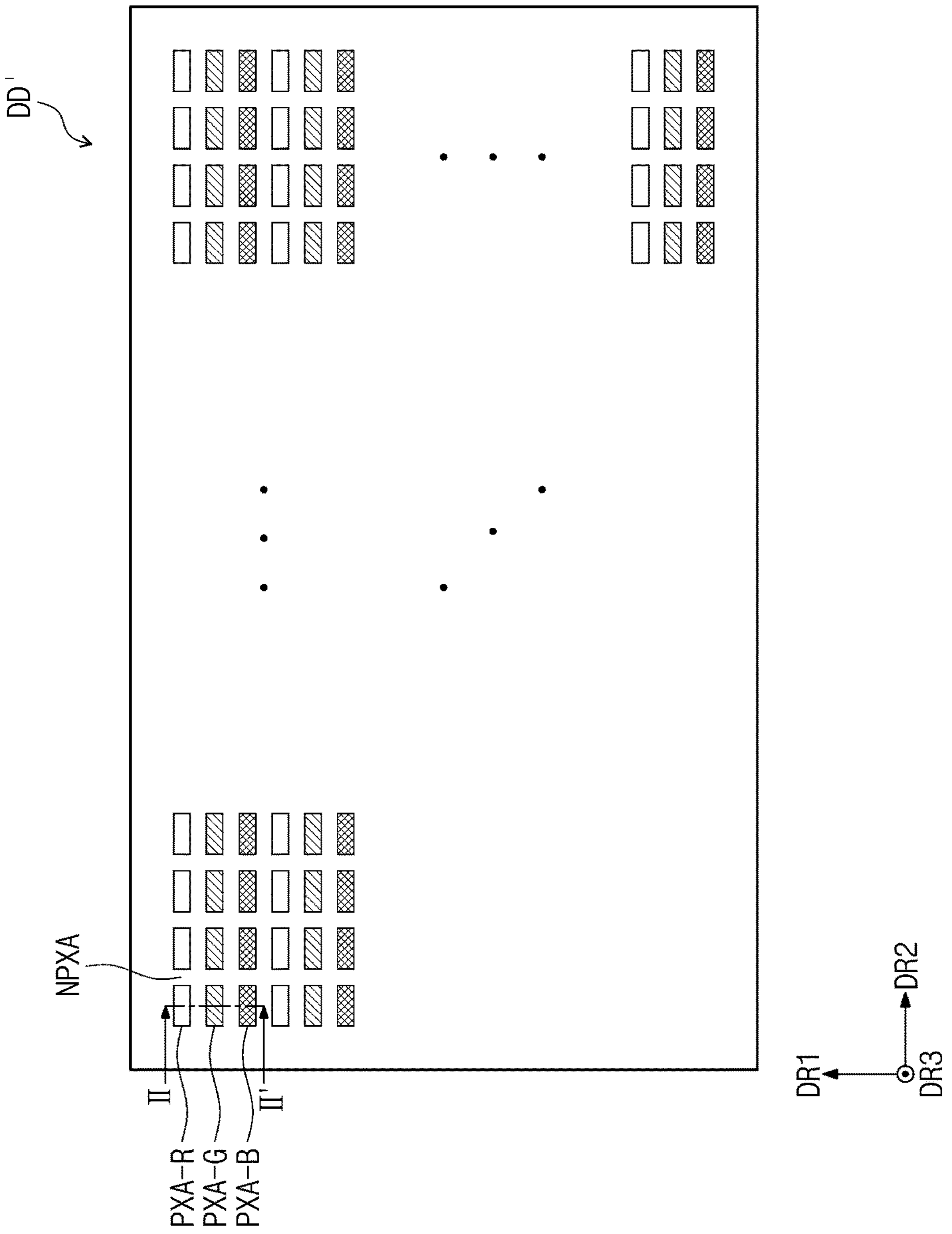
FIG. 4 is a plan view illustrating a portion of a display module according to embodiments.
Figure 5:
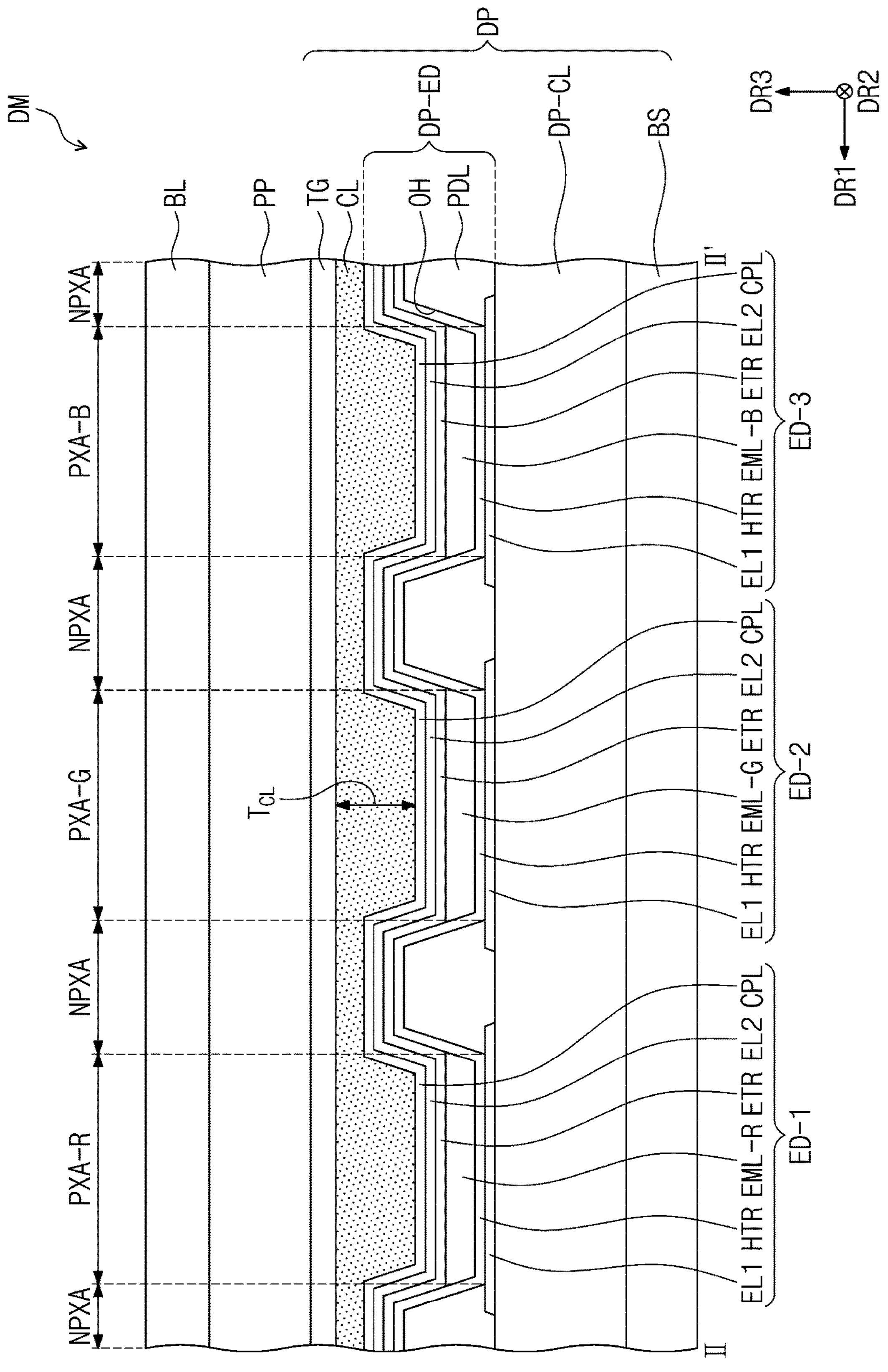
FIG. 5 is a cross-sectional view of a display module according to embodiments.

FIG. 4 is a plan view illustrating a portion of a display module according to embodiments. FIG. 5 is a cross-sectional view of a display module according to embodiments. FIG. 4 is a portion corresponding to DD' illustrated in FIG. 2. FIG. 5 is a portion taken along line II-II' of FIG. 4.

Referring to FIGS. 4 and 5, the display device ED according to some embodiments may include a non-light-emitting region NPXA and light-emitting regions PXA-R, PXA-G, and PXA-B. The light-emitting regions PXA-R, PXA-G, and PXA-B may be regions in which light generated by the respective light-emitting elements ED-1, ED-2, and ED-3 is emitted. The light-emitting regions PXA-R, PXA-G, and PXA-B may be spaced apart from each other on a plane.

Each of the light-emitting regions PXA-R, PXA-G, and PXA-B may be a region divided by a pixel defining film PDL. The non-light-emitting region NPXA may be between the adjacent light-emitting regions PXA-B, PXA-G, and PXA-R and may correspond to the pixel defining film PDL. In this specification, the light-emitting regions PXA-R, PXA-G, and PXA-B may respectively correspond to pixels. The pixel defining film PDL may divide the light-emitting elements ED-1, ED-2, and ED-3. Light-emitting layers EML-R, EML-G, and EML-B of the light-emitting elements ED-1, ED-2, and ED-3 may be separated in the openings OH defined in the pixel defining film PDL.

The light-emitting regions PXA-B, PXA-G, and PXA-R may be classified into a plurality of groups according to the color of light generated from the light-emitting elements ED-1, ED-2, and ED-3. In the display device ED according to embodiments illustrated in FIG. 5, three light-emitting regions PXA-R, PXA-G, and PXA-B respectively emitting red light, green light, and blue light are illustrated as examples. For example, the display device ED according to some embodiments may include a red light-emitting region PXA-R, a green light-emitting region PXA-G, and a blue light-emitting region PXA-B that are distinguished from each other.

In the display device ED according to some embodiments, the plurality of light-emitting elements ED-1, ED-2, and ED-3 may emit light of different wavelength ranges. For example, in some embodiments, the display device ED may include a first light-emitting element ED-1 that emits red light, a second light-emitting element ED-2 that emits green light, and a third light-emitting element ED-3 that emits blue light. In some embodiments, the red light-emitting region PXA-R, the green light-emitting region PXA-G, and the blue light-emitting region PXA-B of the display device ED may respectively correspond to the first light-emitting element ED-1, the second light-emitting element ED-2, and the third light-emitting element ED-3.

However, embodiments of the present disclosure are not limited thereto, and the first to third light-emitting elements ED-1, ED-2, and ED-3 may emit light of the same wavelength range or at least one of the first to third light-emitting elements ED-1, ED-2, or ED-3 may emit light of a different wavelength range. For example, all of the first to third light-emitting elements ED-1, ED-2, and ED-3 may emit blue light.

The light-emitting regions PXA-R, PXA-G, and PXA-B in the display device ED according to some embodiments may be in a stripe shape. Referring to FIG. 4, a plurality of red light-emitting regions PXA-R, a plurality of green light-emitting regions PXA-G, and a plurality of blue light-emitting regions PXA-B may be each aligned along the second direction axis DR2. In addition, the light-emitting regions may be alternately n the order of the red light-emitting region PXA-R, the green light-emitting region PXA-G, and the blue light-emitting region PXA-B along the first direction axis DR1.

FIGS. 4 and 5 illustrate that areas of the light-emitting regions PXA-R, PXA-G, and PXA-B are all similar, but embodiments of the present disclosure are not limited thereto. Thus, the areas of the light-emitting regions PXA-R, PXA-G, and PXA-B may be different from each other depending on the wavelength range of the emitted light. In some embodiments, the areas of the light-emitting regions PXA-R, PXA-G, and PXA-B may each be an area as viewed on a plane defined by the first direction axis DR1 and the second direction axis DR2.

An arrangement form of the light-emitting regions PXA-R, PXA-G, and PXA-B is not limited to what is illustrated in FIG. 4, however, and the order in which the red light-emitting region PXA-R, the green light-emitting region PXA-G, and the blue light-emitting region PXA-B are arranged may be provided in various suitable configurations and/or combinations according to the characteristics of display quality required or desired for the display device ED. For example, the arrangement form of the light-emitting regions PXA-R, PXA-G, and PXA-B may be a PENTILE® arrangement (e.g., an RGBG matrix, RGBG structure, or RGBG matrix structure) or a Diamond Pixel™ arrangement, but the present disclosure is not limited thereto. PENTILE® is a duly registered trademark of Samsung Display Co., Ltd.

In addition, the areas of light-emitting regions PXA-R, PXA-G, and PXA-B may be different from each other. For example, in some embodiments, the area of the green light-emitting region PXA-G may be smaller than the area of the blue light-emitting region PXA-B, but embodiments of the present disclosure are not limited thereto.

Each of the first to third light-emitting elements ED-1, ED-2, and ED-3 may respectively include a first electrode EL1, a hole transport region HTR, light-emitting layers EML-R, EML-G, and EML-B, an electron transport region ETR, a second electrode EL2, and a capping layer CPL.

The first electrode EL1 has conductivity (e.g., electrical conductivity). The first electrode EL1 may be formed of a metal material, a metal alloy, and/or a conductive compound. The first electrode EL1 may be an anode or a cathode. However, embodiments of the present disclosure are not limited thereto. In addition, the first electrode EL1 may be a pixel electrode. The first electrode EL1 may be a transmission electrode, a transflective electrode, or a reflective electrode. The first electrode EL1 may include at least one selected from Ag, Mg, Cu, Al, Pt, Pd, Au, Ni, Nd, Ir, Cr, Li, Ca, LiF, Mo, Ti, W, In, Sn, and Zn, two or more compounds selected from thereamong, a mixture of two or more selected from thereamong, and/or oxides thereof.

When the first electrode EL1 is a transmission electrode, the first electrode EL1 may include a transparent metal oxide, for example, indium tin oxide (ITO), indium zinc oxide (IZO), zinc oxide (ZnO), indium tin zinc oxide (ITZO), and/or the like. When the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca (stacked structure of LiF and Ca), LiF/AI (stacked structure of LiF and Al), Mo, Ti, W, and/or a compound and/or mixture (e.g., a mixture of Ag and Mg) including the same. In some embodiments, the first electrode EL1 may have a multilayer structure including a reflective film or semi-transmission film formed of the above material and a transparent conductive film formed of ITO, IZO, ZnO, ITZO, and/or the like. For example, the first electrode EL1 may have a three-layer structure of ITO/Ag/ITO, but is not limited thereto. In addition, embodiments of the present disclosure are not limited thereto, and the first electrode EL1 may include the above-described metal material, a combination of two or more metal materials selected from among the above-described metal materials, and/or oxides of the above-described metal materials. The first electrode EL1 may have a thickness of about 700 Å to about 10000 Å. For example, the first electrode EL1 may have a thickness of about 1000 Å to about 3000 Å.

The hole transport region HTR is provided on the first electrode EL1. The hole transport region HTR may include at least one of a hole injection layer, a hole transport layer, a buffer layer and/or light-emitting auxiliary layer, or an electron blocking layer. The hole transport region HTR may have a thickness of, for example, about 50 Å to about 15,000 Å.

The hole transport region HTR may have a single layer formed of a single material, a single layer formed of a plurality of different materials, or a multi-layered structure that has a plurality of layers formed of a plurality of different materials.

For example, the hole transport region HTR may have a structure of a single layer of a hole injection layer or a hole transport layer, and may have a structure of a single layer formed of a hole injection material and a hole transport material. In some embodiments, the hole transport region HTR may have a structure of a single layer formed of a plurality of different materials, or a structure such as a hole injection layer/hole transport layer, a hole injection layer/hole transport layer/buffer layer, a hole injection layer/buffer layer, a hole transport layer/buffer layer, or a hole injection layer/hole transport layer/electron blocking layer which are sequentially stacked from the first electrode EL1, but embodiments of the present disclosure are not limited thereto.

The hole transport region HTR may be formed through various suitable methods such as a vacuum evaporation method, a spin coating method, a cast method, a Langmuir-Blodgett (LB) method, an inkjet printing method, a laser printing method, and/or a laser induced thermal imaging (LITI) method.

The light-emitting layer EML-R, EML-G, EML-B is provided on the hole transport region HTR. For example, the light-emitting layer EML-R, EML-G, EML-B may have a thickness of, for example, about 100 Å to about 1000 Å, or about 100 Å to about 300 Å. The light-emitting layer EML-R, EML-G, EML-B may have a single layer formed of a single material, a single layer formed of a plurality of different materials, or a multi-layered structure that has a plurality of layers formed of a plurality of different materials.

In the light-emitting elements ED-1, ED-2, and ED-3 according to some embodiments, the light-emitting layer EML-R, EML-G, EML-B may include an anthracene derivative, a pyrene derivative, a fluoranthene derivative, a chrysene derivative, a dihydrobenzanthracene derivative, and/or a triphenylene derivative. For example, the light-emitting layer EML-R, EML-G, EML-B may include the anthracene derivative and/or the pyrene derivative.

The electron transport region ETR may have a single layer formed of a single material, a single layer formed of a plurality of different materials, or a multi-layered structure that has a plurality of layers formed of a plurality of different materials.

For example, the electron transport region ETR may have a structure of a single layer of an electron injection layer or an electron transport layer, and may have a structure of a single layer formed of an electron injection material and an electron transport material. In some embodiments, the electron transport region ETR may have a structure of a single layer formed of a plurality of different materials, or a structure such as an electron transport layer/electron injection layer, or a hole blocking layer/electron transport layer/electron injection layer, which are sequentially stacked from the first electrode EL1, but embodiments of the present disclosure are not limited thereto. The electron transport region ETR may have a thickness of, for example, about 1000 Å to about 1500 Å.

The electron transport region ETR may be formed through various suitable methods such as a vacuum evaporation method, a spin coating method, a cast method, a Langmuir-Blodgett (LB) method, an inkjet printing method, a laser printing method, and/or a laser induced thermal imaging (LITI) method.

The capping layer CPL may be on the second electrode EL2 of each of the light-emitting elements ED-1, ED-2, and ED-3 according to embodiments. The capping layer CPL may include a multilayer or a single layer.

In some embodiments, the capping layer CPL may be an organic layer. For example, the capping layer CPL may include α-NPD, NPB, TPD, m-MTDATA, $Alq_3$, CuPc, N4,N4,N4',N4'-tetra(biphenyl-4-yl) biphenyl-4,4'-diamine (TPD15), 4,4',4"-tris(carbazol sol-9-yl)triphenylamine (TCTA), and/or the like, and/or may include an epoxy resin, and/or an acrylate such as a methacrylate. However, embodiments of the present disclosure are not limited thereto, and the capping layer CPL may include at least one selected from among compounds P1 to P5 below.

P1

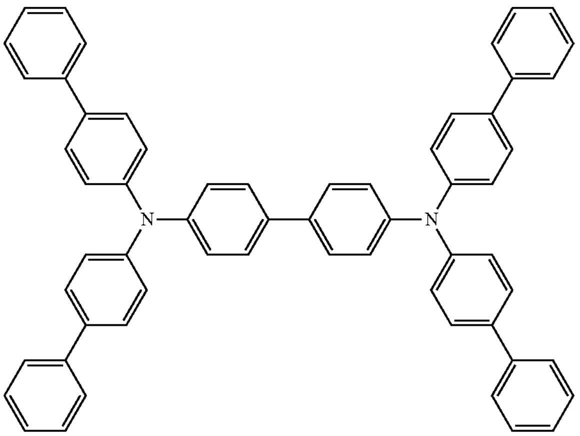

P2

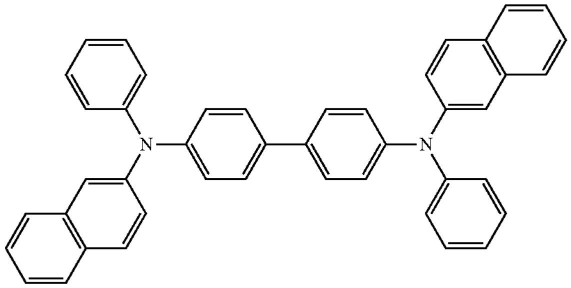

P3

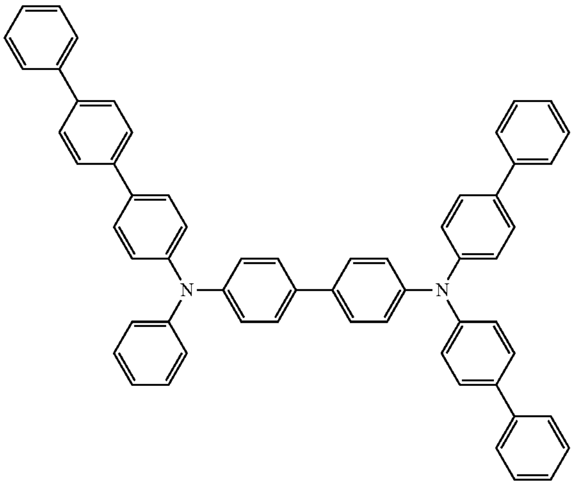

P4

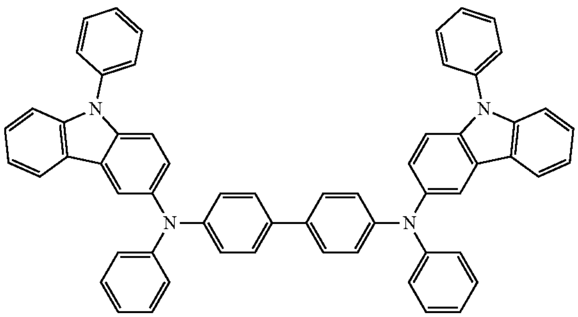

-continued

P5

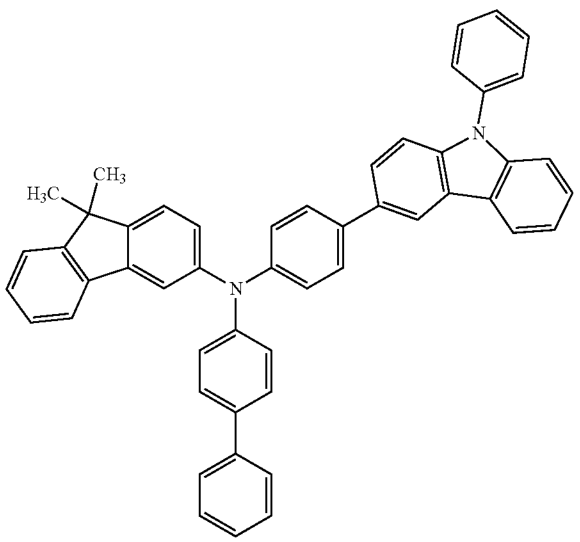

In some embodiments, the capping layer CPL may have a refractive index of about 1.6 or more. For example, the capping layer CPL may have a refractive index of about 1.6 or more for light in a wavelength range of about 550 nm to about 660 nm.

In some embodiments, the encapsulation substrate TG may be on the display element layer DP-ED. The filling layer CL may be between the display element layer DP-ED and the encapsulation substrate TG. The filling layer CL may be formed through an inkjet printing method, a spin coating method, a slit coating method, a jet dispensing method, and/or a screen printing method. However, this is merely an example, and embodiments of the present disclosure are not limited thereto.

The filling layer CL may include a filler derived from a mixture containing a first polymer compound, a second polymer compound, and a crosslinking compound. The first polymer compound and the second polymer compound may be different from each other. The crosslinking compound may crosslink a plurality of first polymer compounds, crosslink a plurality of second polymer compounds, or crosslink a first polymer compound and a second polymer compound.

The first polymer compound may be a silicone-based polymer. For example, the first polymer compound may include a first monomer containing a first silicon atom and four vinyl alkoxy groups each bonded to the first silicon atom and each having a vinyl group at a terminal end thereof. The first polymer compound according to some embodiments may be formed by repeatedly bonding first monomers. The plurality of first monomers may be bonded to each other by a vinyl group to form the first polymer compound. In some embodiments, one first monomer may be bonded to four first monomers.

The second polymer compound may be a polysilicon-based polymer. For example, the second polymer compound may include a second monomer containing a second silicon atom and two vinyl alkoxy groups each bonded to the second silicon atom and having a vinyl group at a terminal end thereof. The second polymer compound according to some embodiments may be formed by repeatedly bonding second monomers. The plurality of second monomers may be bonded to each other by a vinyl group to form the second polymer compound. In some embodiments, one second monomer may be bonded to four second monomers.

The first polymer compound may have a bulkier structure than the second polymer compound. The weight of the first polymer compound included in the mixture may be greater than the weight of the second polymer compound included in the mixture. The weight of the first polymer compound included in the filler may be greater than the weight of the second polymer compound. As the filler according to some embodiments includes the bulky first polymer compound, reactivity between the filler and the capping layer CPL may be lowered (e.g., reactivity of the filler to the capping layer CPL may be reduced). When the reactivity between the filler and the capping layer CPL is lowered, defects such as dark spots appearing in the active region ED-AA (see FIG. 1) may be reduced. Accordingly, the display quality of the display device ED (see FIG. 1) according to some embodiments may be improved.

The crosslinking compound may include a third silicon atom and may include at least one hydrogen atom directly bonded to the third silicon atom. The hydrogen atom directly bonded to the third silicon atom in the crosslinking compound may be radically decomposed with the third silicon atom (e.g., may be decomposed by way of radical decomposition to form a hydrogen radical and a silicon radical). The crosslinking compound may be one in which a hydrogen atom and a radically decomposed third silicon atom are bonded to (e.g., react with) a vinyl group of the first polymer compound or a vinyl group of the second polymer compound. Accordingly, the crosslinking compound may polymerize a plurality of first polymer compounds, polymerize a plurality of second polymer compounds, or polymerize at least one first polymer compound and at least one second polymer compound.

In addition, in the crosslinking compound, the oxygen atom and $R_{51}$ (described herein below) may be radically decomposed. The oxygen atom of the crosslinking compound may be bonded to (e.g., reacted with) a vinyl group of the first polymer compound or a vinyl group of the second polymer compound. Accordingly, the crosslinking compound may polymerize a plurality of first polymer compounds, polymerize a plurality of second polymer compounds, or polymerize at least one first polymer compound and at least one second polymer compound.

In some embodiments, the first polymer compound may include a first monomer represented by Formula 1 below.

[Formula 1]

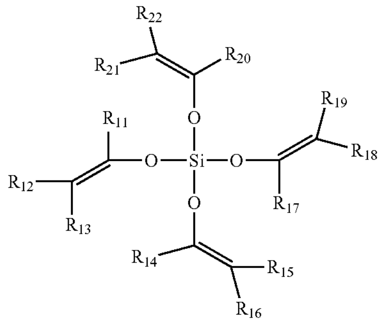

In Formula 1, $R_{11}$ to $R_{22}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group. $R_{11}$ to $R_{22}$ may be all the same, or at least one thereof may be different from the others. For example, $R_{11}$ to $R_{22}$ may be all hydrogen atoms.

In some embodiments, the second polymer compound may include a second monomer represented by Formula 2 below.

[Formula 2]

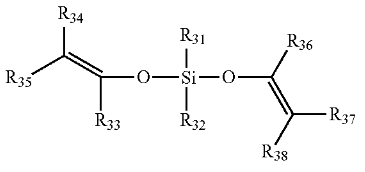

In Formula 2, $R_{31}$ to $R_{38}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group. $R_{31}$ to $R_{38}$ may be all the same, or at least one thereof may be different from the others. For example, $R_{31}$ to $R_{38}$ may be all hydrogen atoms.

In some embodiments, the crosslinking compound may include a third monomer represented by Formula A below.

[Formula A]

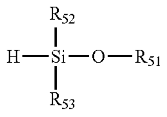

In Formula A, $R_{51}$ to $R_{53}$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group. $R_{51}$ to $R_{53}$ may be all the same, or at least one thereof may be different from the others.

In some embodiments, in Formula A, the third monomer may include a first sub-monomer in which at least one of $R_{52}$ or $R_{53}$ is a substituted or unsubstituted phenyl group, and a second sub-monomer in which neither $R_{52}$ nor $R_{53}$ is a substituted or unsubstituted phenyl group. For example, the crosslinking compound may include a first sub-monomer represented by any one of Formulas B or C below.

[Formula B]

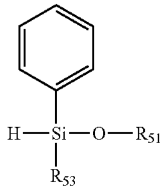

-continued

[Formula C]

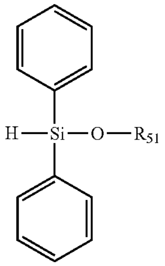

In Formula B, $R_{51}$ and $R_{53}$ may be same as defined with respect to Formula A above. In Formula C, $R_{51}$ may be same as defined with respect to Formula A above.

In some embodiments, when the crosslinking compound includes the first sub-monomer in which at least one of $R_{52}$ or $R_{53}$ is a substituted or unsubstituted phenyl group, the reactivity between the capping layer CPL and the filler may be lowered (e.g., reduced) due to the steric hindrance of the substituted or unsubstituted phenyl group. When the reactivity between the filler and the capping layer CPL is lowered (e.g., reduced), defects such as dark spots appearing in the active region ED-AA (see FIG. 1) may be reduced. Accordingly, the display quality of the display device ED (see FIG. 1) according to some embodiments may be improved. For example, the crosslinking compound may include, with respect to the total number of third monomers, about 20% to about 50% of the first sub-monomer in which at least one of $R_{52}$ or $R_{53}$ is a substituted or unsubstituted phenyl group.

The term "substituted or unsubstituted," as used in this specification, may mean being substituted or unsubstituted with at least one substituent selected from the group consisting of a deuterium atom, a halogen atom, a cyano group, a nitro group, an amino group, a silyl group, a oxy group, a thiol group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. In addition, each of the substituents provided above as examples may be substituted or unsubstituted. For example, a biphenyl group may be interpreted as an aryl group or a phenyl group substituted with a phenyl group.

In this specification, the alkyl group may have a linear, branched or cyclic chain. The number of carbon atoms in the alkyl group is 1 to 50, 1 to 30, 1 to 20, 1 to 10, or 1 to 6. Examples of the alkyl group may include methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyl octyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldodecyl group, 2-octyldodecyl group, n-tridecyl group, n-tetradecyl group, n-pentadecyl group, n-hexa decyl group, 2-ethylhexadecyl group, 2-butylhexadecyl group, 2-hexylhexadecyl group, 2-octylhexadecyl group, n-heptadecyl group, n-octadecyl group, n-nonadecyl group, n-icosyl group, 2-ethyl icosyl group, 2-butyl icosyl group, 2-hexyl icosyl group, 2-octyl icosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, and the like, but embodiments of the present disclosure are not limited thereto.

In this specification, the aryl group means any suitable functional group or substituent derived from an aromatic hydrocarbon ring. The aryl group may be a monocyclic aryl group or a polycyclic aryl group. The number of ring-forming carbon atoms of the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quarterphenyl group, a quinquephenyl group, a sexiphenyl group, a triphenylenyl group, a pyrenyl group, a benzofluoranthenyl group, a chrysenyl group, and the like, but embodiments of the present disclosure are not limited thereto.

In some embodiments, the mixture may include about 60 wt % to about 80 wt % of the first polymer compound with respect to the total weight of the mixture. When the mixture contains less than about 60 wt % of the first polymer compound, the effect of lowering reactivity of the filling layer CL with the capping layer CPL may be insignificant (e.g., reduced). When the mixture contains more than about 80 wt % of the first polymer compound, the filling layer CL thus formed may be brittle. For example, in some embodiments, the mass ratio between the first polymer compound and the crosslinking compound included in the mixture may be about 2:1 to about 8:1.

In some embodiments, at least one of the first polymer compound or the second polymer compound may include at least one epoxy group at a terminal end thereof. For example, at least one selected from among $R_1$ to $R_{22}$ in Formula 1 and $R_{31}$ to $R_{38}$ in Formula 2 may be an epoxy group. When at least one of the first polymer compound or the second polymer compound includes at least one epoxy group at a terminal end thereof, the adhesion between the filling layer CL and the encapsulation substrate TG may be improved. For example, when the encapsulation substrate TG is a glass substrate, an epoxy group of at least one of the first polymer compound or the second polymer compound is hydrogen-bonded with the glass substrate, and thus, the encapsulation substrate TG and the filling layer CL are bonded, thereby improving the adhesion between thereof.

In some embodiments, at least one of the first polymer compound or the second polymer compound may include at least one epoxy group at a terminal end thereof, and the crosslinking polymer may include a substituted or unsubstituted phenyl group at a terminal end thereof. For example, the first polymer compound may include a first monomer in which at least one among $R_1$ to $R_{22}$ in Formula 1 is an epoxy group, the second polymer compound may include a second monomer in which at least one selected from among $R_{31}$ to $R_{38}$ in Formula 2 is an epoxy group, and the crosslinked polymer may include a third monomer in which at least one of $R_{52}$ or $R_{53}$ is a substituted or unsubstituted phenyl group. Accordingly, the filling layer CL according to embodiments may have excellent adhesion to the encapsulation substrate TG and at the same time have a lowered (e.g., reduced) reactivity with the capping layer CPL.

In some embodiments, the mixture may further include a thermal initiator and a polymerization inhibitor. The thermal initiator may initiate polymerization of at least two of the first polymer compound, the second polymer compound, or a crosslinking agent. For example, the mixture according to some embodiments may include one kind or a mixture of two or more kinds of: an azo-based compound, as a thermal initiator, such as, for example, 2,2'-azobis(2-methylbutyronitrile), 2,2'-azobis(isobutyronitrile), 2,2'-azobis(2,4-dimethylvaleronitrile), 4, 4-azobis(4-cyanovaleric acid), 1,1'-azobis(cyclohexanecarbonitrile) or 2,2'-azobis(4-methoxy-2,4-dimethylvaleronitrile); a peroxy-based compound such as, for example, tetramethylbutylperoxy neodecanoate (e.g., Perocta ND, manufactured by NOF), bis(4-butylcyclohexyl) peroxydicarbonate (e.g., Peroyl TCP, manufactured by NOF), di(2-ethylhexyl) peroxy carbonate, butyl peroxy neodecanoate (e.g., Perbutyl ND, manufactured by NOF), dipropyl peroxy dicarbonate (e.g., Peroyl NPP, manufactured by NOF), diisopropyl peroxydicarbonate (e.g., Peroyl IPP, manufactured by NOF), diethoxyethyl peroxy dicarbonate (e.g., Peroyl EEP, manufactured by NOF), diethoxyhexyl peroxy dicarbonate (e.g., Peroyl OEP, manufactured by NOF), hexyl peroxydicarbonate (e.g., Perhexyl ND, manufactured by NOF, dimethoxybutyl peroxy dicarbonate (e.g., Peroyl MBP, manufactured by NOF), bis (3-methoxy-3-methoxybutyl) peroxy dicarbonate (e.g., Peroyl SOP, manufactured by NOF), dibutyl peroxy dicarbonate, dicetyl peroxy dicarbonate, dimyristyl peroxy dicarbonate, 1,1,3,3-tetramethylbutyl peroxypivalate, hexyl peroxy pivalate (e.g., Perhexyl PV, manufactured by NOF), butyl peroxy pivalate (e.g., Perbutyl, manufactured by NOF), trimethyl hexanoyl peroxide (e.g., Peroyl 355, manufactured by NOF), dimethyl hydroxybutyl peroxyneodecanoate (e.g., Luperox 610M75, manufactured by Atofina), amyl peroxyneodecanoate (e.g., Luperox 546M75, manufactured by Atofina), butyl peroxyneodecanoate (e.g., Luperox 10M75, manufactured by Atofina), t-butylperoxy neoheptanoate, amylperoxy pivalate (e.g., Luperox 546M75, manufactured by Alofina), t-butylperoxy pivalate, t-amylperoxy-2-ethylhexanoate, lauryl peroxide, dilauroyl peroxide, didecanoyl peroxide, benzoyl peroxide, dibenzoyl peroxide, 2,2-bis(tert-butylperoxy)butane, 1,1-bis(tert-butylperoxy)cyclohexane, 2,5-bis(butylperoxy)-2,5-dimethylhexane, 2,5-bis(tert-butylperoxy)-1-methylethyl)benzene, 1,1-bis(tert-butyl peroxy)-3,3,5-trimethylcyclohexane, tert-butyl hydroperoxide, tert-butyl peroxide, tert-butyl peroxybenzoate, tert-butylperoxy isopropyl carbonate, cumene hydroxyperoxide, dicumyl peroxide, lauroyl peroxide or 2,4-pentanedione peroxide; a tert-butyl peracetate; or a peracetic acid or potassium persulfate, but embodiments of the present disclosure are not limited thereto.

A polymerization inhibitor may terminate a polymerization reaction initiated by an initiator. For example, the polymerization inhibitor may include, but is not limited to, hydroquinone, hydroquinone monomethyl ether, p-benzoquinone, phenothiazine, or a mixture thereof.

In some embodiments, the mixture has a viscosity of about 1000 cP to about 20000 cP at 25° C. In some embodiments, the filling layer CL may have a thickness $T_{CL}$ of about 4 μm to about 8 μm. When the filling layer CL has a thickness $T_{CL}$ of less than about 4 μm, the effect of improving the optical path difference of the filling layer CL may be insignificant or reduced. When the filling layer CL has a thickness $T_{CL}$ of more than about 8 μm, it becomes difficult to seal the display element layer DP-ED by the encapsulation substrate TG (see FIG. 3) and the sealing member SM (see FIG. 3).

The refractive index of the filling layer CL may be adjusted for light extraction efficiency. For example, in some embodiments, the filling layer CL may have a refractive index of about 1.4 to about 1.5. With respect to light having a central wavelength of about 400 nm to about 700 nm, the filling layer CL may have a transmittance of about 90% or more. The display device ED (see FIG. 1) according to some embodiments may include the filling layer CL having a transmittance of about 90% or more, and may thus have excellent light extraction efficiency.

A display device according to some embodiments includes a filling layer having a filler containing a bulky polymer compound. When the filler includes the bulky polymer compound, the reactivity with a capping layer may be lowered (e.g., reduced) compared with when the filler includes a small polymer compound. Accordingly, the display device according to some embodiments may have fewer defects such as dark spots and have excellent display quality.

A display device according to embodiments of the present disclosure may include a filling layer between a display panel and an encapsulation substrate and having a filler derived from a mixture containing a bulky first polymer compound, a second polymer compound, and a crosslinking compound. Accordingly, the display device may exhibit excellent display quality by lowering (e.g., reducing) reactivity with a light-emitting element.

Although example embodiments of the present disclosure have been described, it is understood that the subject matter of the present disclosure should not be limited to these embodiments but various changes and modifications can be made by one of ordinary skill in the art within the spirit and scope of the present disclosure as defined by the appended claims, and equivalents thereof.

What is claimed is:

1. A display device comprising:

a base layer;

a display element layer comprising a light-emitting element on the base layer;

an encapsulation substrate on the display element layer; and a filling layer between the display element layer and the encapsulation substrate and comprising a filler derived from a mixture having a first polymer compound containing a first monomer represented by Formula 1 below, a second polymer compound containing a second monomer represented by Formula 2 below, and a crosslinking compound,

[Formula 1]

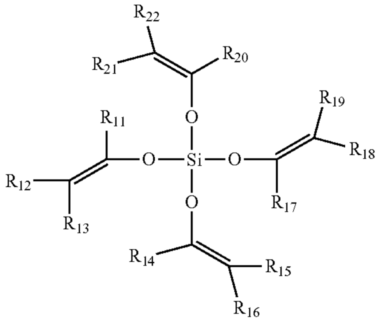

-continued

[Formula 2]

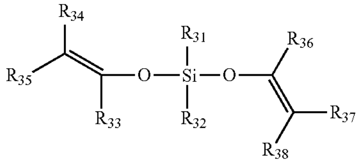

wherein, in Formula 1, $R_{11}$ to $R_{22}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group, and in Formula 2, $R_{31}$ to $R_{38}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group.

2. The display device of claim 1, wherein the crosslinking compound comprises a third monomer represented by Formula A below:

[Formula A]

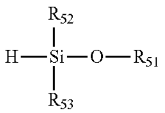

wherein, in Formula A, $R_{51}$ to $R_{53}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group.

3. The display device of claim 2, wherein, in Formula A, the crosslinking compound comprises a first sub-monomer in which at least one of $R_{52}$ or $R_{53}$ is a substituted or unsubstituted phenyl group, and a second sub-monomer in which neither $R_{52}$ nor $R_{53}$ is a substituted or unsubstituted phenyl group.

4. The display device of claim 3, wherein the crosslinking compound includes about 20% to about 50% of the first sub-monomer with respect to the total number of the third monomer.

5. The display device of claim 1, wherein, in the mixture, the mass ratio between the first polymer compound and the crosslinking compound is about 2:1 to about 8:1.

6. The display device of claim 1, wherein at least one selected from among $R_{11}$ to $R_{22}$ in Formula 1 and $R_{31}$ to $R_{38}$ in Formula 2 is an epoxy group.

7. The display device of claim 1, wherein the encapsulation substrate is a glass substrate.

8. The display device of claim 1, wherein the mixture has a viscosity of about 1000 cP to about 20000 cP at 25° C.

9. The display device of claim 1, wherein the filling layer has a thickness of about 4 μm to about 8 μm.

10. The display device of claim 1, wherein the filling layer has a refractive index of about 1.4 to about 1.5.

11. The display device of claim 1, wherein a transmittance of the filling layer with respect to light having a center wavelength of about 400 nm to about 700 nm is about 90% or more.

12. The display device of claim 1, wherein the mixture further comprises a thermal initiator and a polymerization inhibitor.

13. The display device of claim 1, wherein the light-emitting element comprises:

a first electrode;

a hole transport region on the first electrode;

a light-emitting layer on the hole transport region;

an electron transport region on the light-emitting layer;

a second electrode on electron transport region; and a capping layer on the second electrode.

14. The display device of claim 13, wherein the capping layer comprises at least one selected from among compounds P1 to P5 below

P1

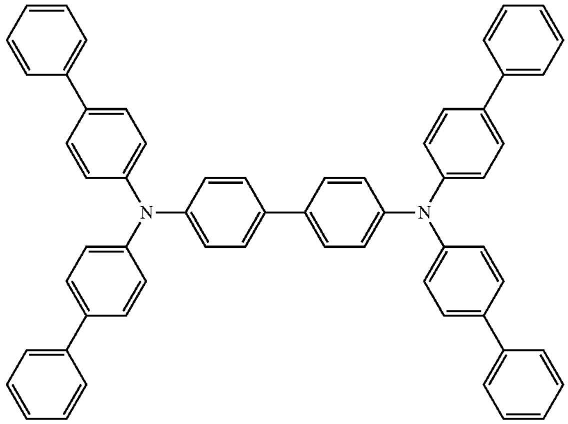

P2

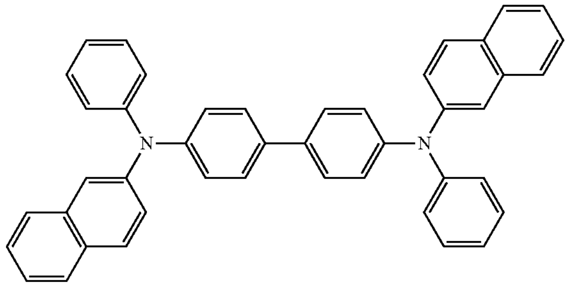

P3

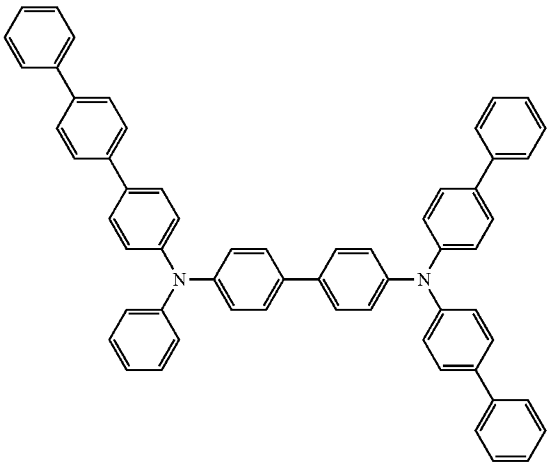

-continued

P4

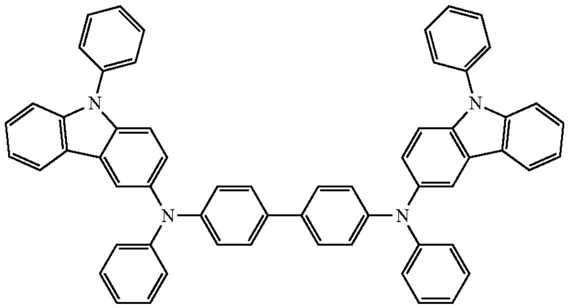

P5

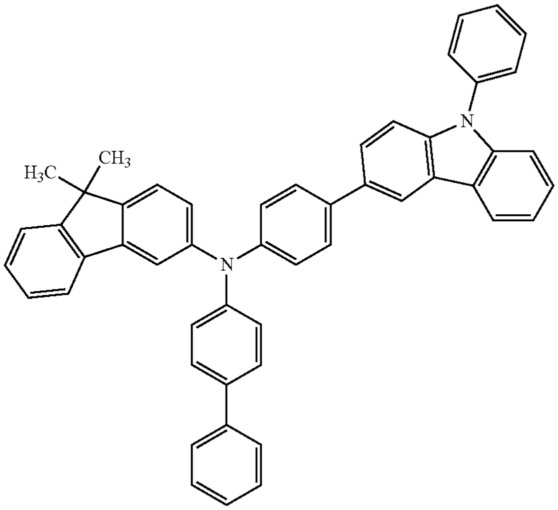

.

15. A display device comprising:

a base layer;

a display element layer on the base layer and including a light-emitting element;

an encapsulation substrate on the display element layer; and a filling layer between the display element layer and the encapsulation substrate and comprising a filler derived from a mixture containing a first polymer compound, a second polymer compound, and a crosslinking compound, wherein the first polymer compound comprises a first monomer having a first silicon atom and four vinyl alkoxy groups each containing a vinyl group at a terminal end thereof and each bonded to the first silicon atom, and the second polymer compound comprises a second monomer having a second silicon atom and two vinyl alkoxy groups each containing a vinyl group at a terminal end thereof and each bonded to the second silicon atom, and wherein the crosslinking compound comprises a third monomer represented by Formula A below:

[Formula A]

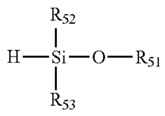

wherein, in Formula A, $R_{51}$ to $R_{53}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group, and wherein, at least one of $R_{52}$ or $R_{53}$ is a substituted or unsubstituted phenyl group.

16. The display device of claim 15, wherein the first monomer is represented by Formula 1 below, and the second monomer is represented by Formula 2 below

[Formula 1]

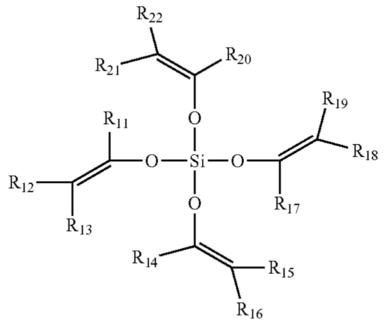

[Formula 2]

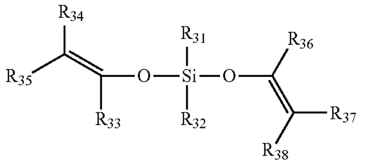

where, in Formula 1, $R_{11}$ to $R_{22}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group, and in Formula 2, $R_{31}$ to $R_{38}$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or an epoxy group.

17. The display device of claim 16, wherein at least one selected from among $R_{11}$ to $R_{22}$ in Formula 1 and $R_{31}$ to $R_{38}$ in Formula 2 is an epoxy group.

18. The display device of claim 15, wherein the light-emitting element comprises:

a first electrode;

a hole transport region on the first electrode;

a light-emitting layer on the hole transport region;

an electron transport region on the light-emitting layer;

a second electrode on electron transport region; and a capping layer on the second electrode, the capping layer comprising an organic material.

19. The display device of claim 1, wherein the display device is a mobile phone, a tablet PC, a car navigation monitor, a game console, or a wearable device.

* * * * *